United States Patent
Li et al.

(10) Patent No.: US 9,318,850 B2
(45) Date of Patent: Apr. 19, 2016

(54) SHIELDING A CONNECTOR TO REDUCE INTERFERENCE

(71) Applicant: Intel Corporation, Santa Clara, CA (US)

(72) Inventors: Xiang Li, Portland, OR (US); Hao-Han Hsu, Portland, OR (US); Yun Ling, Portland, OR (US); Gong Ouyang, Olympia, WA (US); Kai Xiao, University Place, WA (US); Jiangqi He, Mesa, AZ (US); Lu-Vong T. Phan, DuPont, WA (US); Wei Xu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/286,494

(22) Filed: May 23, 2014

(65) Prior Publication Data

US 2015/0340817 A1 Nov. 26, 2015

(51) Int. Cl.
*H01R 12/00* (2006.01)
*H01R 13/6598* (2011.01)
*H01R 12/72* (2011.01)
*H05K 3/28* (2006.01)
*H05K 3/36* (2006.01)
*H01R 43/18* (2006.01)

(52) U.S. Cl.
CPC .......... *H01R 13/6598* (2013.01); *H01R 12/721* (2013.01); *H01R 43/18* (2013.01); *H05K 3/284* (2013.01); *H05K 3/36* (2013.01); *Y10T 29/49128* (2015.01)

(58) Field of Classification Search
CPC ............. H01R 13/6598; H01R 12/721; H01R 13/648; H01R 13/66
USPC .......................................................... 439/62
See application file for complete search history.

(56) References Cited

U.S. PATENT DOCUMENTS

| 6,089,920 | A  | * | 7/2000 | Farnworth et al. ............ 439/632 |
| 7,993,147 | B2 | * | 8/2011 | Cole et al. ....................... 439/79 |
| 2002/0050516 | A1 | * | 5/2002 | Kitchen ....................... 235/441 |
| 2002/0110336 | A1 | * | 8/2002 | Dair et al. ........................ 385/92 |
| 2004/0069997 | A1 | * | 4/2004 | Dair et al. ........................ 257/81 |
| 2004/0224559 | A1 | * | 11/2004 | Nelson et al. ................. 439/608 |
| 2004/0266231 | A1 | * | 12/2004 | Costello et al. ................ 439/92 |
| 2008/0268702 | A1 | * | 10/2008 | Little et al. ................. 439/541.5 |
| 2013/0178075 | A1 | * | 7/2013 | Hsueh .............................. 439/62 |

OTHER PUBLICATIONS

U.S. Appl. No. 14/227,009, filed Mar. 27, 2014, entitled "Pogo-Pins for High Speed Signaling," by Hao-Han Hsu.

* cited by examiner

*Primary Examiner* — Jean F Duverne
(74) *Attorney, Agent, or Firm* — Trop, Pruner & Hu, P.C.

(57) ABSTRACT

In an embodiment, a connector such as an edge connector includes a connector housing, a first set of pins configured within the housing and having first ends to couple to corresponding signal lines of a first circuit board and second ends to couple to corresponding signal lines of a mating connector of a second circuit board, and a conductive material adapted to the housing to reduce interference caused by one or more sources of interference. Other embodiments are described and claimed.

16 Claims, 6 Drawing Sheets

US 9,318,850 B2

SHIELDING A CONNECTOR TO REDUCE INTERFERENCE

TECHNICAL FIELD

Embodiments relate to connector technologies, and more particularly to connectors having reduced interference.

DETAILED DESCRIPTION

Figure 1:
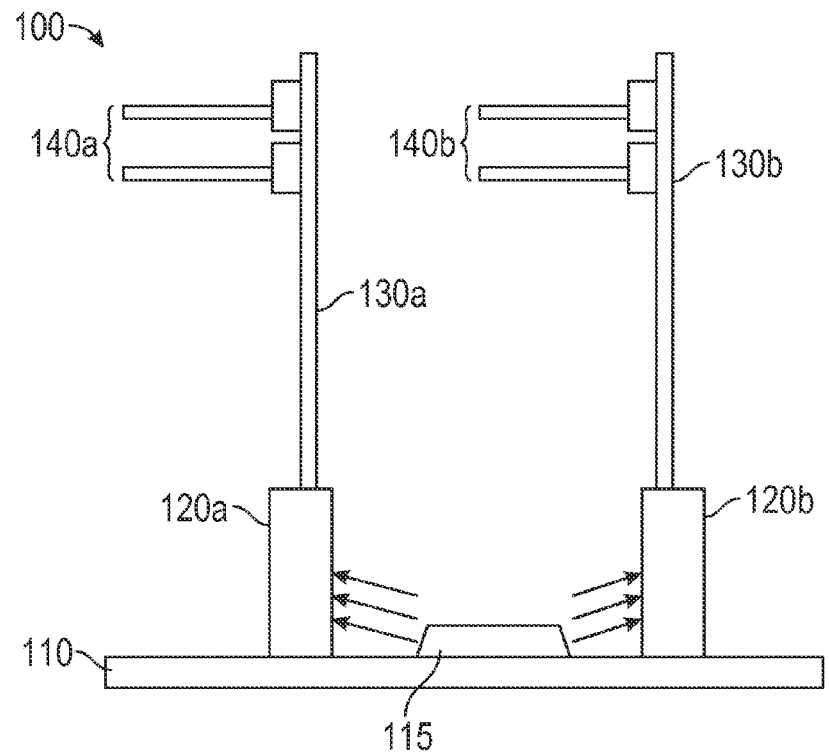
FIG. 1 is an illustration of a system arrangement including a card edge connector in accordance with an embodiment of the present invention.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from to disclosed subject matter. For example, the disclosed embodiments are not limited to desktop computer systems or Ultrabooks™ and may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

Embodiments may be used to reduce electromagnetic interference (EMI) and/or radio frequency interference (RFI) emanating from a variety of radiation sources from impacting connector pins (signal nets) of electrical connectors of a system that are in proximity to sources of interference. Embodiments may also reduce crosstalk between the connector pins.

Such interference can lead to various failures in a system. The interference can affect signal integrity and may cause data and other errors. For example, a high speed differential bus lane failover error may be caused by coupling from interference sources. Such errors may be reduced or prevented using embodiments of the present invention. Thus embodiments mitigate EMI, RFI, or other interference that couples through the air into connector pins, e.g., from high di/dt or dv/dt sources.

Referring now to FIG. 1, shown is a system arrangement including a card edge connector in accordance with an embodiment of the present invention. As shown a system 100 may be any type of computer system that includes a card edge connector such as a server computer, desktop computer, portable computer, tablet computer, smartphone and the like. In the portion of system 100 shown, a plurality of card edge connectors 120a and 120b (generally card edge connector 120) are provided. Edge connector 120 may be any type of edge connector and may be configured with any desired amounts of pins, connecting schemes and so forth to enable interconnection of multiple electrical components.

In examples used herein, card edge connector 120 may be configured for adaptation onto a circuit board 110 such as a motherboard or baseboard of a server computer, client computer system or so forth. In turn, a mating card edge connector of another circuit board, such as a riser card on which multiple memory modules may be adapted, may connect into card edge connector 120, in a particular system implementation.

Still with reference to FIG. 1, configured on circuit board 110 is a voltage regulator 115 in close proximity to connectors 120. Although the scope of the present invention is not so limited, voltage regulator 115 may be situated within approximately 100 to 300 mils of one or more of connectors 120. In an embodiment, voltage regulator 115 may be a switching voltage regulator although in other embodiments a different type of regulator may be present. Due to the high speed operation of the switching that occurs within voltage regulator 115, EMI occurs (as shown by the arrows in FIG. 1) and can negatively impact performance of various components of the system. In the specific embodiments described herein, understand that such EMI interference may adversely impact communications along sensitive signal lines such as pins within connectors 120 carrying signal communications.

In the embodiment shown, card edge connectors 120 correspond to riser connectors to which additional circuit boards 130a and 130b (generally circuit board 130) are coupled. More particularly, riser connectors 120 may be of a socket or female type configured to receive a plug or male card edge connector of corresponding circuit boards 130. In the implementation of FIG. 1, riser circuit boards 130 may be memory riser boards to which a plurality of memory modules, namely dual inline memory modules (DIMMs) 140a and 140b are coupled.

Using an embodiment of the present invention, the impact on connectors 120 of EMI emanating from voltage regulator 115 can be reduced. As will be described further herein, conductive shielding such as metal shielding which may be implemented in various manners can be adapted around or within connectors 120 to reduce or avoid EMI emanating from voltage regulator 115 or similar circuitry from impacting signal communications through connectors 120. Although shown at this high level in the embodiment of FIG. 1, understand the scope of the present invention is not limited in this regard. For example in other situations, additional or different sources of interference may be present, such as RFI that may result from, e.g., wireless interface(s) coupled to circuit board 110.

Figure 2:
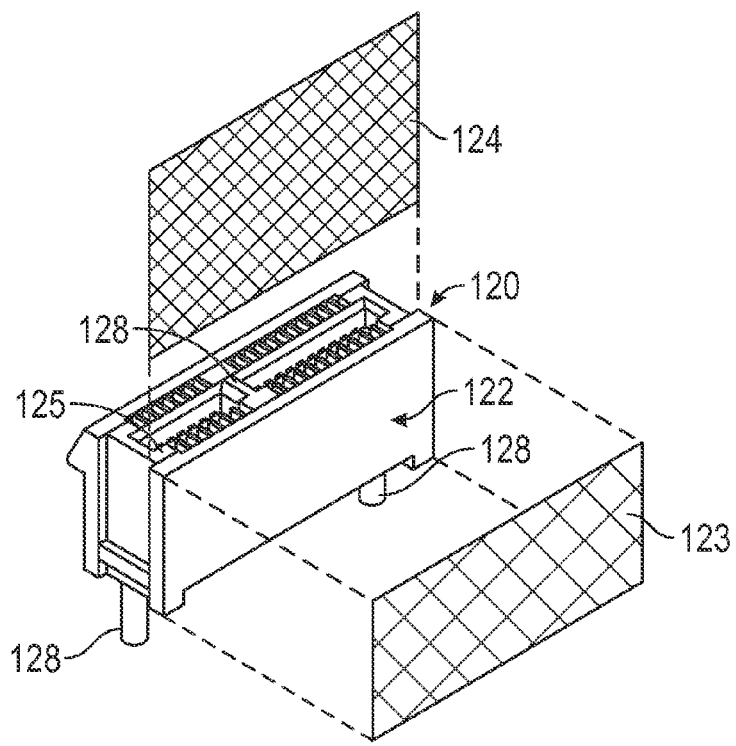
FIG. 2 is an illustration of a card edge connector in accordance with another embodiment of the present invention.

Referring now to FIG. 2, shown is an illustration of a card edge connector in accordance with another embodiment of the present invention. As seen in FIG. 2, card edge connector 120, which may be the same as card edge connectors 120 of FIG. 1, includes a socket portion to which a corresponding mating portion of another card edge connector may be installed. As further shown, card edge connector 120 is formed as a housing 122, which may be a given non-conductive material such as a plastic in which a plurality of pins (not shown for ease of illustration in FIG. 2) are housed. Within card edge connector 120, a key portion 128 is provided to ensure that a corresponding male card edge connector of another circuit board is properly inserted. Card edge connector 120 further includes retention posts 128, which in an embodiment may be also used as ground connections to enable coupling to a ground plane such as a ground plane of the circuit board to which connector is to be installed.

According to various embodiments, some type of conductive shield is provided to enable signal communications via card edge connector 120 to occur with minimal or no interference, either from sources of EMI or sources of RF interference, or both. In the illustration of FIG. 2, various manners of implementing this conductive shielding may be realized. As seen, a first method provides a conductive coating 123 that can be applied to the exterior of housing 122. In various embodiments, different types of conductive coatings such as aluminum or nano materials may be provided. And different manners to provide that coating can occur. In some embodiments, a spray coating technique may be used to coat the exterior of housing 122. In other embodiments, a spin coating process or any other type of coating process such as plating or vacuum metalizing may be used.

Either in the same embodiment or another embodiment, conductive shielding may also be realized via a conductive shield 124 which may be embedded within housing 122 of card edge connector 120. In some embodiments a single such shield may be provided per connector to enable shielding from varying sources of interference. Instead in other embodiments, multiple such shields may be provided. As an example two shields may be provided, one on either side of a socket portion 125, which includes pins that provide interconnection between corresponding contacts on interconnected components (e.g., two circuit boards). Such pins may include both signal pins and ground pins.

In one embodiment, shield 124 may be implemented using a mesh to isolate interference. As one example, housing 122 may be formed via a molding technique in which the housing material (e.g., plastic) is formed around one or more such plates. For example, in one embodiment, an injection molding technique may be used in which a plastic or other non-conductive material is injected into a mold including one or more of these conductive plates. Conductive shield 124 may be configured with various types of metal, such as aluminum, brass, copper, and bronze, as examples. Note that rather than a single mesh plane as shown in FIG. 2, a complex shape may be used. For example, in other examples an individual mesh can be embedded within each signal pin housing within socket portion 125 to provide maximum isolation to the signal pins.

To prevent electrostatic discharge concerns, any coating and/or shield 124 may be grounded, e.g., to a circuit ground. In one such embodiment, one or more retention posts 128 may be used as a pathway for such ground contact. Of course in other examples a shield and/or coating may be coupled through other ground connection in contact with one or more ground planes present in one or more of the circuit boards or other components coupled together via card edge connector 120.

Figure 3A:
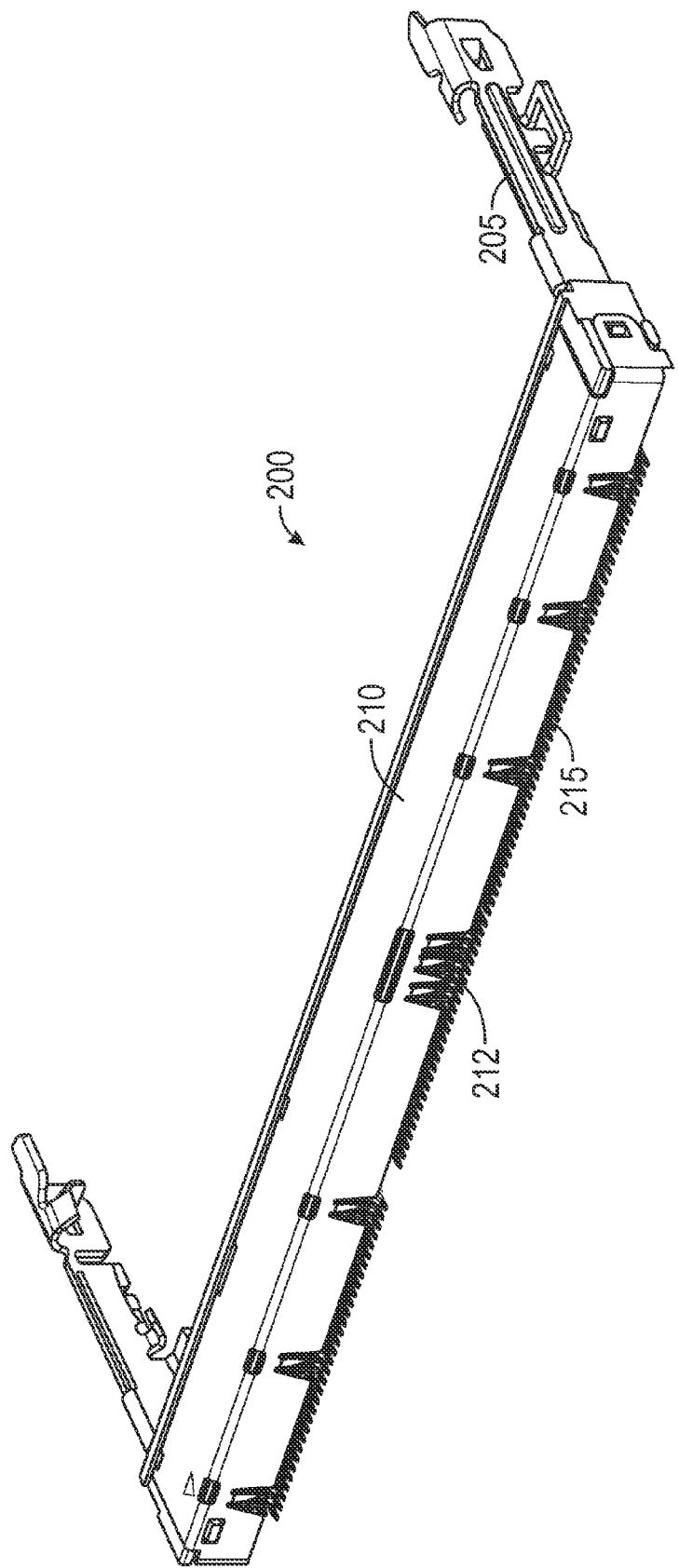
FIG. 3A is a block diagram of a shielding according to another embodiment of the present invention.

Although shown at this high level in the embodiment of FIG. 2, understand that a connector shielding may take many forms. That is, the techniques described herein can be applied to many different types of connectors. Note that certain memory components such as dynamic random access memories can generate large amounts of EMI and RFI in mobile and other systems, which may cause failure of regulation and radio degradation. Thus in addition to the edge connector described above, embodiments may apply equally to a memory module edge connector such as a DIMM connector. Referring now to FIG. 3A, shown is a block diagram of a shielding according to another embodiment of the present invention. As shown in FIG. 3A, a memory connector 200 is present. As seen, connector 200 includes a frame portion 205 into which a memory module such as one or more DIMM modules may be inserted (understand that such DIMM modules are formed of one or more circuit boards having memory chips coupled thereto, and are not shown in FIG. 3A for ease of illustration).

As with the above discussion, interference may be present due to other circuitry or signals emanating from circuitry within a system and thus a shield 210 may be adapted to connector 200. More specifically, a metal or other conductive shield 210 is adapted to a terminal or mating portion of frame portion 205 to shield signal pins of connector 200 from such interference.

Shield 210 thus shields signal and clock pins within connector 200 and forms a semi-Faraday cage with a circuit board to which connector 200 is adapted. Note that in many situations, there can be very limited direct connections between shield 210 and such circuit board. This is because of a great number of signal and clock lines to be routed, and therefore no more ground connections can be made. Without sufficient ground connections, the effectiveness of this metal cage may be reduced.

To this end, a plurality of ground contacts or grounding fingers 212 may be adapted along shield 210 to further enhance the shielding effectiveness. As these fingers may connect to existing ground pins/pads of connector 200, no additional grounding pins/pads are required and no additional burden is added to the dense routing. Note that fingers 212 also may significantly reduce the impedance between the shield and circuit board ground, without the penalty of additional ground pads and through holes on the circuit board.

Although the number of fingers formed on a shield (for contacting ground pins) can vary in different embodiments, in a DIMM connector implementation such as in FIG. 3A, multiple ground finger connections may be used to establish a sufficient ground path to the circuit board ground. Further, such fingers may suppress potential self-resonance of the connector.

Various openings may be provided within shield 210 to enable connection of fingers 212 that in turn can couple to ground pins within connector 200 to enable sufficient grounding of shield 210 to a ground plane within one or more circuit boards.

Note that the openings in which fingers 212 are provided may be realized by cutting, brazing or otherwise creating openings in shield 210. As such, in an embodiment fingers 212 may be formed as part of shield 210 itself and configured, e.g., by appropriate bending or other positioning, to enable contact with corresponding ground pins of a DIMM module inserted into DIMM connector 200.

Figure 3B:
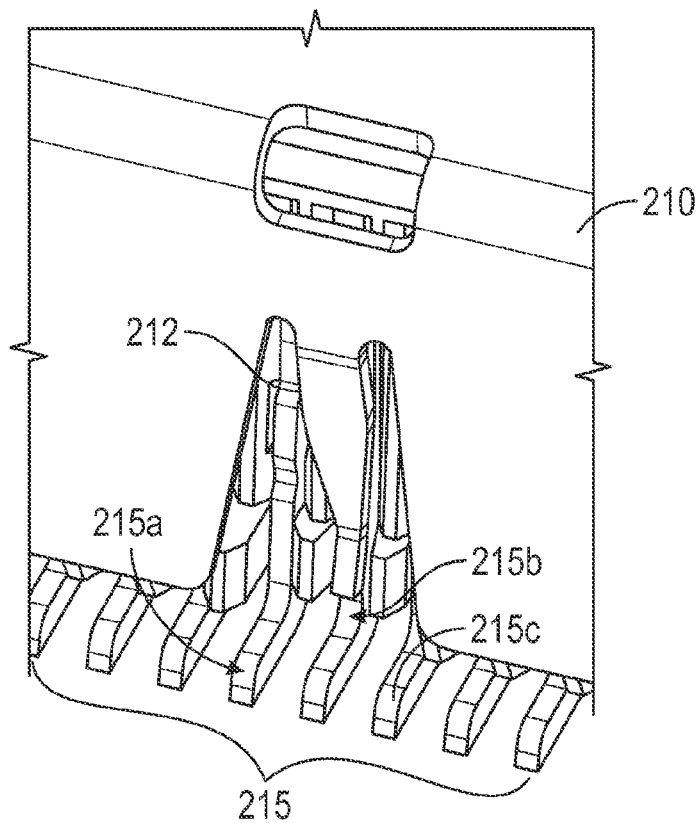
FIG. 3B is a close up view of a ground contact in accordance with one embodiment of the present invention.

Referring now to FIG. 3B, shown is a close up view of one such ground contact. As seen, ground finger 212 is bent inward from shield 210 to make contact with a ground pin 215*b* of a set of pins 215 of connector 200. As illustrated, ground pin 215*b* is adjacent to various signal pins including signal pins 215*a* and 215*c*. Of course understand that while shown with this type of opening and integrated ground fingers formed of the unitary body of shield 210, embodiments are not so limited, and in other implementations ground fingers or other ground contacts may couple between shield 210 and corresponding ground pins of an edge connector such as DIMM connector 200.

Figure 4:
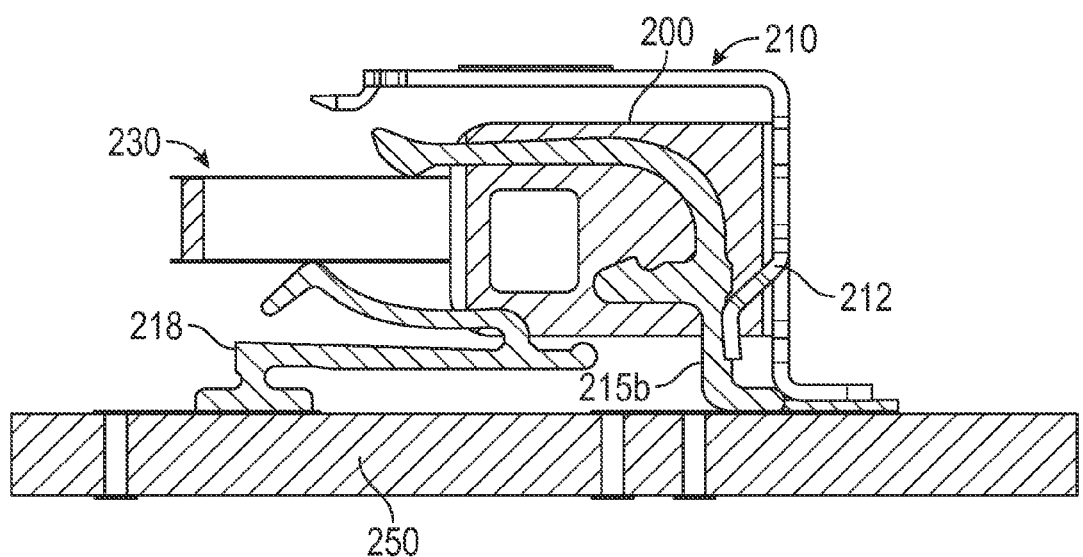
FIG. 4 is a cross section of an arrangement in accordance with an embodiment.

Next referring to FIG. 4, shown is a cross section of an arrangement in accordance with an embodiment. As shown in FIG. 4, shield 210 substantially surrounds at least a portion of an edge connector 200, which in the embodiment shown is a DIMM connector to which a DIMM module 230 is inserted. In turn, edge connector 200 is mounted on a circuit board 250, e.g., a motherboard, via a set of pins (of which a single ground pin 215*b* is illustrated). Further adaptation of DIMM module 230 to edge connector 200 is realized by a support bracket 218.

Shield 210 thus acts to isolate the connecting portion between DIMM module 230 and connector 200 from sources of interference, e.g., including EMI and RF interference. Furthermore, to increase shielding effectiveness, ground finger 212 of shield 210 contacts ground pin 215*b*, which in turn is coupled to a ground plane of circuit board 250 via appropriate connection on the circuit board. In this way, an extra grounding path is provided to increase shield effectiveness. Of course other configurations to provide additional ground contacting between a shield and an appropriate ground such as a circuit board ground plane can occur in other embodiments.

Note that in a mobile or other small form factor system, many potential sources of interference can be in close proximity to a DIMM or other edge connector. In an example system, an antenna such as a dual-band wireless antenna may be placed within a few centimeters of a DIMM connector. The antenna coupling, which is directly proportional to the RFI level, may be suppressed by 10-15 dB in most frequency bands, including long term evolution (LTE) and wireless bands using an embodiment of the present invention.

Thus by using an embodiment, interfering components may be placed closer to shielded connectors, enabling reduced real estate and smaller form factor circuit boards. Still further, less control of passives on voltage regulator switching nodes or other interference sources may occur, which can improve performance of these devices.

Figure 5:
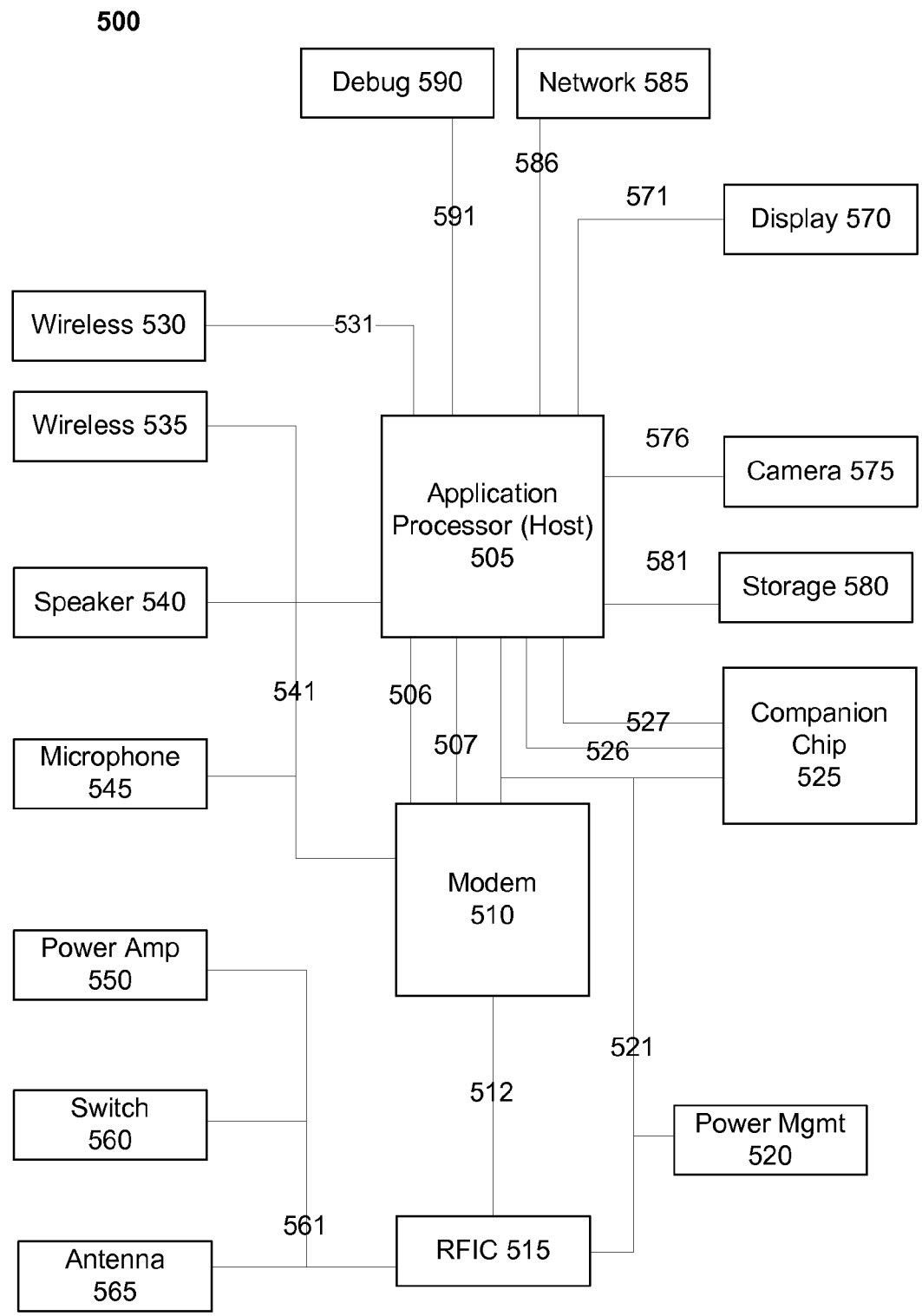
FIG. 5 is a block diagram of a system in accordance with an embodiment of the present invention.

Referring to FIG. 5, an embodiment of a low power computing platform is depicted. In one embodiment, low power computing platform 500 includes a user endpoint, such as a phone, smartphone, tablet, ultraportable notebook, a notebook, a desktop, a server, a transmitting device, a receiving device, or any other known or available computing platform. The illustrated platform depicts a number of different interconnects to couple multiple different devices. Exemplary discussion of these interconnects are provided below to provide options on implementation and inclusion. One or more of these interconnects may be coupled to components via connectors provided with conductive shielding as described herein. However, a low power platform 500 is not required to include or implement the depicted interconnects or devices. Furthermore, other devices and interconnect structures that are not specifically shown may be included.

Starting at the center of the diagram, platform 500 includes an application or host processor 505. As one example, processor 505 is implemented as a system on a chip (SoC). As a specific illustrative example, processor 505 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor.

As further shown in FIG. 5, host processor 505 couples to various devices. Different types of communication protocols, including MIPI, PCIe, USB, DVI, among many others, may be used to provide interconnection. In the specific implementation shown in FIG. 5, processor 505 couples to a first wireless device 530 via an interconnect 531. In an embodiment, wireless device 530 is a local area wireless device such as a wireless device in accordance with a given one or more IEEE 802.11 standard. To provide output audio, host processor 505 couples to one or more speakers 540.

Host processor 505 couples to a network device 585 via an interconnect 586 and further couples to a debug device 590 via an interconnect 591. To provide output of display information, e.g., high definition video content, host processor 505 may be in communication with a display 570 such as a flat panel display, a touchscreen or other display, via an interconnect 571.

For purposes of receiving incoming capture information such as via a still and/or video camera, an interconnect 576 couples host processor 505 to a camera device 575. A storage 580, which may be one or more storage devices including volatile and non-volatile memory and other storage devices, couple to host processor 505 via an interconnect 581. For certain peripheral operations, a companion chip 525 may be in communication with host processor 505 via interconnects 526 and 527. In turn, interconnects 506 and 507 couple between host processor 505 and a modem 510 that in turn may couple to a radio frequency integrated circuit (RFIC) 515 via an interconnect 512. Modem 510 further may be in communication with microphone 545 and a second wireless device 535 via an interconnect 541. In an embodiment, second wireless device 535 may be a wide area wireless device such as a wireless device that operates according to a given cellular communication protocol.

Still referring to FIG. 5, various devices couple to RFIC 515 via an interconnect 561. In the embodiment of FIG. 5, these devices include an antenna 565, a switch 560, and a power amplifier 550.

A power management controller 520 couples via an interconnect 521 to various components of the system to provide power management on a platform-wide level. Such power management activities performed by power management controller 520 may be in addition to and/or complementary to power management operations internally controlled by individual devices, such as an internal power management unit of a host processor 505. Although shown at this high level in the implementation of FIG. 5, understand the scope of the present invention is not limited in this regard and many alternatives and variations are possible.

Figure 6:
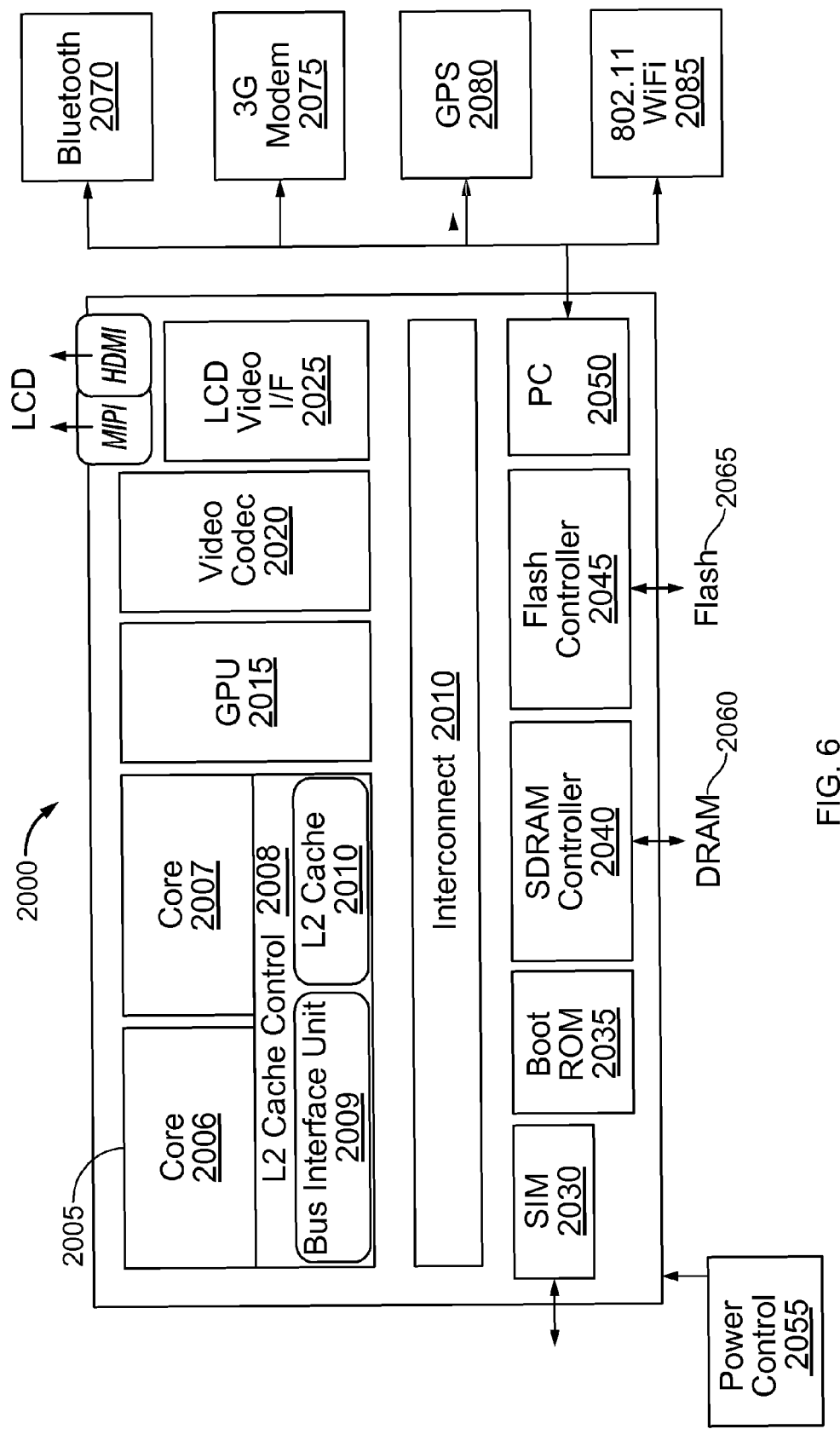
FIG. 6 is a block diagram of a SoC design in accordance with an embodiment.

Turning next to FIG. 6, an embodiment of a SoC design in accordance with an embodiment is depicted. As a specific illustrative example, SoC 2000 is included in user equipment (UE) and may be coupled to other devices of the equipment via one or more connectors having conductive shielding as described herein. In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SoC 2000 includes 2 cores—2006 and 2007. Cores 2006 and 2007 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 2006 and 2007 are coupled to cache control 2008 that is associated with bus interface unit 2009 and L2 cache 2010 to communicate with other parts of system 2000. Interconnect 2010 includes an on-chip interconnect, such as an IOSF, AMBA, or other interconnect discussed above, which potentially implements one or more aspects of the connectors described herein.

Interconnect 2010 provides communication channels to the other components, such as a Subscriber Identity Module (SIM) 2030 to interface with a SIM card, a boot ROM 2035 to hold boot code for execution by cores 2006 and 2007 to initialize and boot SOC 2000, a SDRAM controller 2040 to interface with external memory (e.g. DRAM 2060), a flash controller 2045 to interface with non-volatile memory (e.g. Flash 2065), a peripheral controller 2050 (e.g. Serial Peripheral Interface) to interface with peripherals, video codecs 2020 and Video interface 2025 to display and receive input (e.g. touch enabled input), GPU 2015 to perform graphics related computations, etc. Any of these interfaces may incorporate aspects described herein.

In addition, the system illustrates peripherals for communication, such as a Bluetooth module 2070, 3G modem 2075, GPS 2080, and WiFi 2085. Also included in the system is a power controller 2055. Note as stated above, a UE includes a radio for communication. As a result, these peripheral communication modules are not all required. However, in a UE some form a radio for external communication is to be included.

Figure 7:
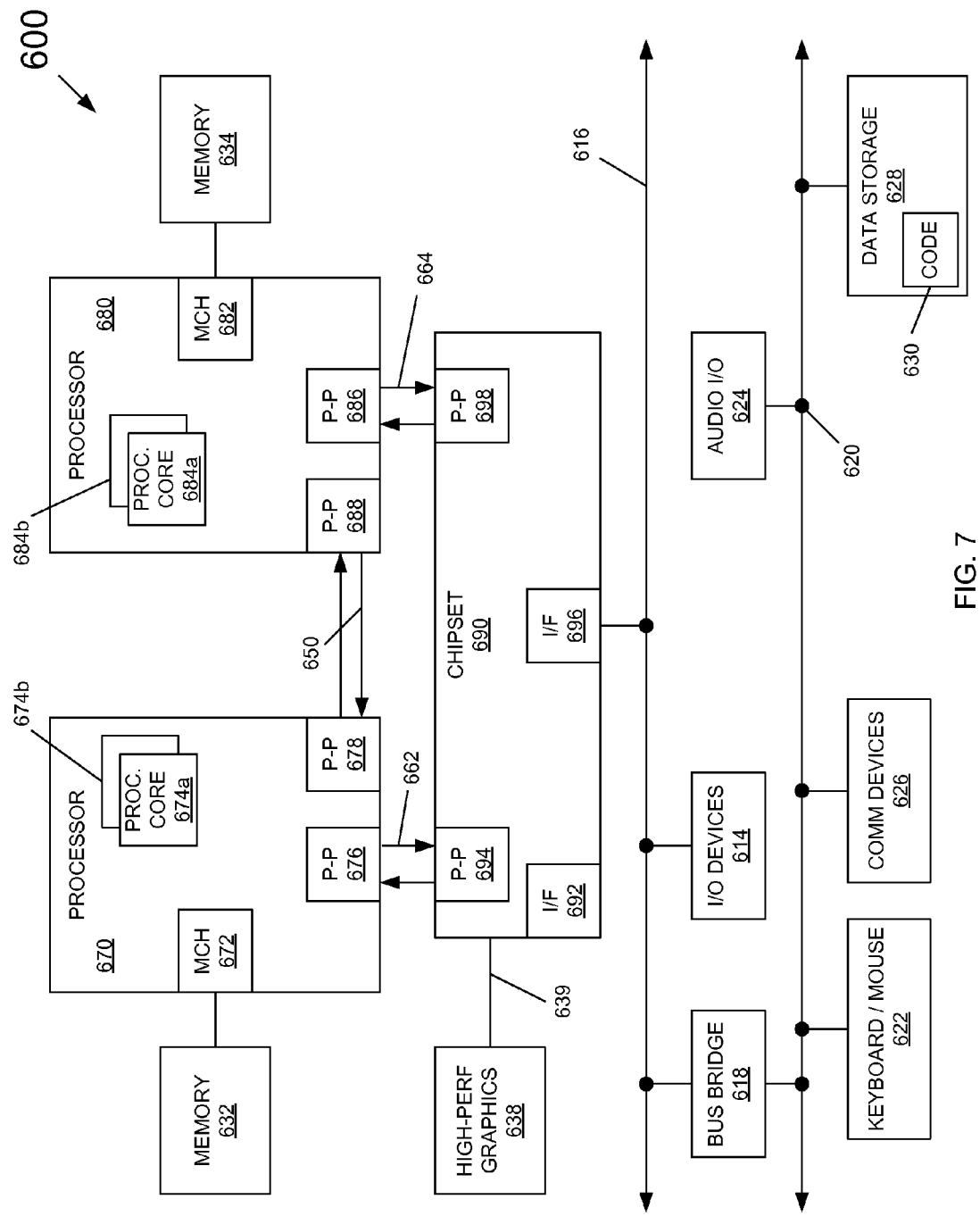
FIG. 7 is a block diagram of a system in accordance with an embodiment of the present invention.

Embodiments may be implemented in many different system types. Referring now to FIG. 7, shown is a block diagram of a system in accordance with an embodiment of the present invention. As shown in FIG. 7, multiprocessor system 600 is a point-to-point interconnect system, and includes a first processor 670 and a second processor 680 coupled via a point-to-point interconnect 650. As shown in FIG. 7, each of processors 670 and 680 may be multicore processors, including first and second processor cores (i.e., processor cores 674a and 674b and processor cores 684a and 684b), although potentially many more cores may be present in the processors.

Still referring to FIG. 7, first processor 670 further includes a memory controller hub (MCH) 672 and point-to-point (P-P) interfaces 676 and 678. Similarly, second processor 680 includes a MCH 682 and P-P interfaces 686 and 688. As shown in FIG. 7, MCH's 672 and 682 couple the processors to respective memories, namely a memory 632 and a memory 634, which may be portions of system memory (e.g., DRAM) locally attached to the respective processors. First processor 670 and second processor 680 may be coupled to a chipset 690 via P-P interconnects 662 and 664, respectively. As shown in FIG. 7, chipset 690 includes P-P interfaces 694 and 698.

Furthermore, chipset 690 includes an interface 692 to couple chipset 690 with a high performance graphics engine 638, by a P-P interconnect 639. In turn, chipset 690 may be coupled to a first bus 616 via an interface 696. As shown in FIG. 7, various input/output (I/O) devices 614 may be coupled to first bus 616, along with a bus bridge 618 which couples first bus 616 to a second bus 620. Various devices may be coupled to second bus 620 including, for example, a keyboard/mouse 622, communication devices 626 and a data storage unit 628 such as a disk drive or other mass storage device which may include code 630, in one embodiment. Further, an audio I/O 624 may be coupled to second bus 620. Note that one or more components of system 600 may be interconnected using connectors with conductive shielding as described herein.

The following examples pertain to further embodiments.

In one embodiment, an edge connector includes: a connector housing; a first set of pins configured within the connector housing and having first ends to couple to corresponding signal lines of a first circuit board and second ends to couple to corresponding signal lines of a mating edge connector of a second circuit board; and a conductive material adapted to the connector housing to reduce interference caused by one or more sources of interference.

In an embodiment, the conductive material comprises a metal coating applied to the connector housing. The conductive material may be a mesh configured within the connector housing. As an example, the mesh may be a plurality of meshes each to shield one of the first set of pins from the one or more sources of interference.

In an embodiment, the conductive material is to couple to a ground plane of the first circuit board. The conductive material may be a shield configured about at least a portion of the edge connector, where the shield is to couple to the ground plane via one or more fingers of the shield. The conductive material may also couple to the ground plane via one or more retention pins of the edge connector.

In an embodiment, the edge connector comprises a riser connector, and in another embodiment, the edge connector comprises a DIMM connector.

In an embodiment, the first circuit board comprises a baseboard having a voltage regulator to couple in close proximity to the edge connector, where the voltage regulator comprises at least one of the one or more sources of interference, the interference comprising electromagnetic interference.

Note that one or more of the circuit boards may include a processor, which can be implemented using various means. In an example, the processor comprises a system on a chip (SoC) incorporated in a user equipment touch-enabled device. In another example, a system comprises a display and a memory, and includes a processor configured on a circuit board to which is coupled one or more card edge connectors of one or more of the above examples.

In another embodiment, an apparatus comprises: a connector to interconnect a first circuit board and a second circuit board, the connector including a first plurality of pins to enable signal interconnection and a second plurality of pins to enable ground interconnection; and a shield adapted about the connector to shield the first plurality of pins from one or more sources of interference, where the shield is to couple to at least one of the second plurality of pins.

In an embodiment, the connector comprises a card edge connector and the first circuit board comprises a motherboard. The card edge connector may be a memory module connector, and the second circuit board may be a memory module circuit board.

In an embodiment, the shield comprises a metal coating applied about an exterior of the connector. As an example, the shield may be at least one mesh configured within the connector. The at least one mesh may be a plurality of meshes, each of which is to house at least one of the first plurality of pins.

In an embodiment, the shield comprises a plurality of fingers each to couple to a corresponding one of the second plurality of pins, and the second plurality of pins are to couple to a ground plane of at least one of the first and second circuit boards.

In another embodiment, a system comprises: a first circuit board; a connector configured on the first circuit board, the connector associated with a conductive shield to shield pins of the connector from a source of interference; a second circuit board coupled to the connector, the connector to interconnect the first circuit board to the second circuit board; and a voltage regulator coupled to the first circuit board, where the voltage regulator is located in close proximity to the connector and comprises at least one source of interference.

In an embodiment, the conductive shield comprises a frame structure adapted to a terminal end of the connector to substantially surround the pins of the connector, where the frame structure comprises a plurality of fingers each coupled to one of the pins of the connector. Each of the pins coupled to one of the plurality of fingers may be coupled to a ground plane of the first circuit board.

In another embodiment, a method comprises: configuring a connector on a first circuit board, the connector associated with a conductive shield to shield pins of the connector from a source of interference; and coupling a second circuit board to the connector to interconnect the first circuit board to the second circuit board.

In an embodiment, the method further comprises applying a conductive coating about an exterior of the connector to form the conductive shield. The method may further comprise configuring at least one mesh within the connector to form the conductive shield. The method may further comprise adapting a frame structure comprising the conductive shield to a terminal end of the connector to substantially surround the pins of the connector, where the frame structure comprises a plurality of fingers each to couple to one of the pins of the connector, each of the pins to couple to one of the plurality of fingers to couple to a ground plane of the first circuit board.

Understand that various combinations of the above examples are possible.

Embodiments may be used in many different types of systems. For example, embodiments can be incorporated into other types of systems including mobile devices such as a smart cellular telephone, tablet computer, netbook, Ultrabook™, or so forth. In one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An edge connector comprising:
   a connector housing formed of a non-conductive material;
   a socket portion included in the connector housing having a first set of pins included within the connector housing and having first ends to couple to corresponding signal lines of a first circuit board and second ends to couple to corresponding signal lines of a mating edge connector of a second circuit board; and
   at least one conductive shield embedded within the connector housing to reduce interference caused by one or more sources of interference.

2. The edge connector of claim 1, further comprising a metal coating applied to an exterior of the connector housing.

3. The edge connector of claim 1, wherein the at least one conductive shield comprises:
   a first mesh embedded within the connector housing adjacent to a first side of the socket portion; and
   a second mesh embedded within the connector housing adjacent to a second side of the socket portion.

4. The edge connector of claim 1, wherein the at least one conductive shield comprises a plurality of meshes each embedded around one of the first set of pins.

5. The edge connector of claim 1, wherein the at least one conductive shield is coupled to one or more retention pins of the edge connector, the one or more retention pins to couple to a ground plane of the first circuit board.

6. The edge connector of claim 1, wherein the edge connector comprises a riser connector.

7. The edge connector of claim 1, wherein the edge connector comprises a dual in-line memory module (DIMM) connector.

8. The edge connector of claim 1, wherein the first circuit board comprises a baseboard having a voltage regulator to couple in close proximity to the edge connector, the voltage regulator comprising at least one of the one or more sources of interference, the interference comprising electromagnetic interference.

9. An apparatus comprising:
- a connector coupled to a first circuit board and a second circuit board, the connector including a first plurality of pins to enable signal interconnection and a second plurality of pins to enable ground interconnection; and
- a shield located about the connector to shield the first plurality of pins from one or more sources of interference, wherein the shield comprises a plurality of openings, each of the plurality of openings including one of a plurality of fingers integrated into the shield and positioned to contact a corresponding one of the second plurality of pins, the second plurality of pins coupled to a ground plane of at least one of the first and second circuit boards.

10. The apparatus of claim 9, wherein the connector comprises an edge connector and the first circuit board comprises a motherboard.

11. The apparatus of claim 10, wherein the edge connector comprises a memory module connector, and the second circuit board comprises a memory module circuit board.

12. The apparatus of claim 9, further comprising a metal coating applied about an exterior of the connector.

13. The apparatus of claim 9, wherein the shield comprises at least one mesh configured within the connector.

14. The apparatus of claim 13, wherein the at least one mesh comprises a plurality of meshes, each of which is to house at least one of the first plurality of pins.

15. A system comprising:
- a first circuit board;
- a connector coupled to the first circuit board, the connector associated with a conductive shield to shield pins of the connector from a source of interference, the conductive shield comprising a frame structure positioned about a terminal end of the connector to substantially surround the pins of the connector, wherein the frame structure comprises a plurality of openings, each of the plurality of openings including one of a plurality of fingers integrated into the frame structure and each coupled to one of the pins of the connector, wherein each of the pins of the connector coupled to one of the plurality of fingers is coupled to a ground plane of the first circuit board;
- a second circuit board coupled to the connector, the connector to interconnect the first circuit board to the second circuit board; and
- a voltage regulator coupled to the first circuit board, wherein the voltage regulator is located in close proximity to the connector and comprises at least one source of interference.

16. The system of claim 15, further comprising a conductive coating adapted about an exterior of the connector.

* * * * *